(12) United States Patent
Montmeat et al.

(10) Patent No.: US 12,288,694 B2
(45) Date of Patent: Apr. 29, 2025

(54) METHOD FOR FORMING PATTERNS ON A SUBSTRATE

(71) Applicant: Commissariat à l'Énergie Atomique et aux Énergies Alternatives, Paris (FR)

(72) Inventors: Pierre Montmeat, Grenoble (FR); Franck Fournel, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 18/804,455

(22) Filed: Aug. 14, 2024

(65) Prior Publication Data
US 2025/0062134 A1  Feb. 20, 2025

(51) Int. Cl.
*H01L 21/3213* (2006.01)
*H01L 21/683* (2006.01)

(52) U.S. Cl.
CPC .. *H01L 21/32134* (2013.01); *H01L 21/32135* (2013.01); *H01L 21/6835* (2013.01)

(58) Field of Classification Search
None
See application file for complete search history.

(56) References Cited

U.S. PATENT DOCUMENTS

| | | | | |
|---|---|---|---|---|
| 4,734,152 A | * | 3/1988 | Geis | H01L 21/31138 216/45 |
| 6,218,628 B1 | * | 4/2001 | Schmidt | H05K 3/403 428/209 |
| 2006/0134922 A1 | * | 6/2006 | Taussig | H01L 27/1288 257/E29.295 |
| 2008/0050858 A1 | * | 2/2008 | Ono | H01L 21/6835 438/114 |
| 2009/0239361 A1 | * | 9/2009 | Igari | H01L 33/0095 438/507 |
| 2011/0017705 A1 | | 1/2011 | Jalabert | |
| 2011/0210468 A1 | * | 9/2011 | Shannon | B32B 38/10 264/139 |
| 2017/0372917 A1 | | 12/2017 | Yoo | |

OTHER PUBLICATIONS

Written Opinion of the French Application No. 2308799, dated Mar. 18, 2024.
Preliminary Search Report for French Application No. 2308799, dated Mar. 18, 2024.
Park et al., Fabrication of graphite grids via stencil lithography for highly sensitive motion sensors. Carbon, Sep. 25, 2015;96:491-6.

* cited by examiner

*Primary Examiner* — Allan W. Olsen
(74) *Attorney, Agent, or Firm* — Wolf, Greenfield & Sacks, P.C.

(57) ABSTRACT

A method comprising the following steps: a) bonding a handle substrate including a base and raised elements to a substrate of interest including a support substrate covered with a thin film, the thin film including a material sensitive to an etchant, whereby the thin film includes first areas not covered with the raised elements and second areas covered with the raised elements, b) performing an etching with the etchant to remove the material sensitive to the etchant present in the first areas, the second areas being protected during the etching, whereby the thin film is structured in the form of raised patterns, c) separating the handle substrate from the substrate of interest.

11 Claims, 4 Drawing Sheets

METHOD FOR FORMING PATTERNS ON A SUBSTRATE

CROSS REFERENCE TO RELATED APPLICATIONS

This application claims priority to French application number 2308799, filed Aug. 18, 2023. The contents of this application are incorporated by reference in its entirety.

TECHNICAL FIELD

The present disclosure generally concerns the field of microelectronics and more particularly the forming of patterns on a substrate for the manufacturing of microelectronic components.

PRIOR ART

The manufacturing of microelectronic components requires the forming of patterns on a substrate by photolithography.

Photolithography is performed by a series of different steps involving a resin: spreading of the resin on a substrate, exposure of the resin by means of a mask, developing, etching and then stripping of the resin. The stripping (or resin cleaning) step is a complex step, since it requires finding a cleaning agent sufficiently aggressive to perfectly clean the resin while preserving the integrity of the different surfaces.

For each substrate on which microelectronic components are to be formed, these different steps are repeated. Now, these step are not only long to implement, but they further generate significant costs, due in particular to the use of the resins, of the solvents, and of the cleaning solutions used.

SUMMARY OF THE INVENTION

There exists a need to obtain a method which enables to form patterns on a substrate while limiting the costs and the duration of the method as compared with current methods.

This aim is achieved by a method of structuring a substrate of interest comprising the following steps:
a) bonding a handle substrate to a substrate of interest, the handle substrate comprising a base and raised elements covering the base, the substrate of interest comprising a support substrate covered with a thin film, the thin film comprising a material sensitive to an etchant, whereby the thin film comprises first areas not covered with the raised elements and second areas covered with the raised elements,
b) performing a wet or gaseous etching with the etchant to remove the material sensitive to the etchant present in the first areas, the second areas being protected during the etching, whereby the thin film is structured in the form of raised patterns,
c) separating the handle substrate from the substrate of interest.

An embodiment provides for the thin film to comprise a base material, preferably an oxide, and more particularly a silicon oxide, having pads, preferably metal pads, and even more preferably copper pads, arranged therein.

An embodiment provides for the material sensitive to the etchant to be the base material.

Another embodiment provides for the material sensitive to the etchant to correspond to the pads.

A specific embodiment provides for the thin film to comprise barriers, preferably metal barriers, and more particularly copper barriers, forming a lateral protection all around the second areas.

Another embodiment provides, during the etch step, for the barriers and the pads to be etched.

Another embodiment provides for the method to comprise an additional step between step b) and step c) during which the barriers and/or the pads are etched.

Another embodiment provides for the method to comprise a subsequent step during which the handle substrate is used to structure another substrate of interest.

Another embodiment provides, prior to the bonding step, for the method to comprise a step during which the handle substrate is covered with a layer of protection against the etchant of the sensitive material. The protective layer may be an oxide layer or a hydrophobic layer, and the hydrophobic layer may be formed of one or a plurality of compounds selected from among silanes, in particular chlorosilanes, and polymers comprising one or a plurality of halogens, preferably fluoropolymers.

Another embodiment provides for the method to comprise, prior to step a), a step during which the handle substrate is manufactured by locally forming a resin on a substrate, by etching the substrate, and by removing the resin.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as "front", "back", "top", "bottom", "left", "right", etc., or relative position qualifiers, such as "top", "bottom", "upper", "lower", etc., or orientation qualifiers, such as "horizontal", "vertical", etc., reference is made unless otherwise specified to the orientation of the drawings.

Unless specified otherwise, the expressions "about", "approximately", "substantially", and "in the order of" signify plus or minus 10%, preferably of plus or minus 5%.

There will now be described in further detail the method of forming patterns on a substrate, first referring to FIGS. 1A to 1E.

Figure 1A:
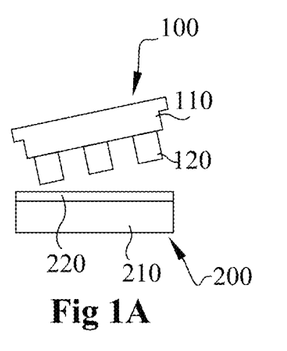
FIGS. 1A, 1B, 1C, 1D, and 1E show, schematically, different steps of a method of structuring a substrate according to a specific embodiment of the invention.
Figure 1B:
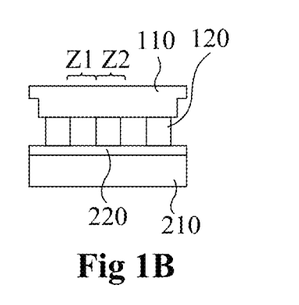
Figure 1C:
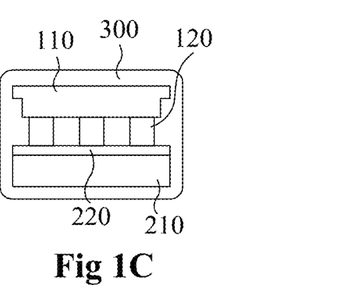
Figure 1D:
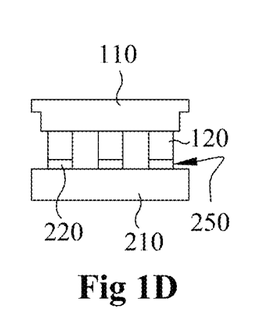
Figure 1E:
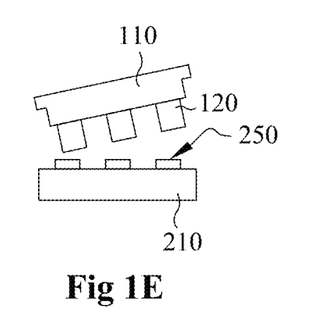

The method comprises the following steps:
a) bonding a handle substrate 100 to a substrate of interest 200, handle substrate 100 comprising a base 110 and raised elements 120 covering base 110, the substrate of interest 200 comprising a support substrate 210 covered with a thin film 220, thin film 220 comprising a material sensitive to an etchant, whereby first areas Z1 of thin film 220 are not covered with the raised elements 120 of handle substrate 100 and second areas Z2 of thin film 220 are covered with the raised elements 120 of handle substrate 100 (FIGS. 1A and 1B),
b) performing a wet or gaseous etching with the etchant adapted to the material sensitive to the etchant, whereby the sensitive material present in the first areas Z1 of thin film 220 is removed, the raised elements 120 of handle substrate 100 protecting the second areas Z2 of thin film 220 during the etching, and a thin film 220 structured in the form of raised patterns 250 is obtained (FIGS. 1C and 1D),
c) separating handle substrate 100 from the substrate of interest 200, whereby a structured substrate of interest 200 comprising a support substrate 210 covered with raised patterns 250 is obtained (FIG. 1E).

The handle substrate 100 forms a hard mask. It enables to form patterns 250 on the substrate of interest without implementing photolithography steps. The method is thus simple and fast to implement.

Further, with one and the same handle substrate 100, it is possible to form patterns on a plurality of substrates (wafers). The handle substrate is reusable, which further decreases process costs.

Prior to step a), it is possible to carry out one or a plurality of pre-treatments on the surface of handle substrate 100 and/or on the surface of the substrate of interest 200 to make them compatible with a direct bonding.

The pre-treatment may be selected from among the following: thermal anneal, plasma, polishing, and wet cleaning.

As an example, it is possible to form an oxide layer on the surface of handle substrate 100 and/or to carry out a polishing step on handle substrate 100 and/or on the substrate of interest 200 to obtain a roughness compatible with a direct bonding (typically a roughness lower than 0.5 nm RMS). It is possible to implement methods which combine, for example, a plasma and an aqueous solution, in particular an oxygen plasma followed by a CARO wet cleaning ($H_2SO_4$, $H_2O_2$ in a 5:1 proportion) associated with SC1 ($H_2O$, $NH_3$, $H_2O_2$ in a 5:1:1 proportion at 70° C.).

During step a), handle substrate 100 and the substrate of interest 200 are brought into contact to be bonded.

The two substrates 100, 200 may be assembled by direct bonding. The use of marks on substrates 100, 200 can facilitate their alignment. An accuracy of approximately 100 nm can be achieved. It is also possible to align them, without using marks, by using the edges of the substrates as well as their notch. The accuracy is lower (+/−50 μm), but sufficient for certain applications.

The direct bonding may be carried out at the atmospheric pressure (that is, 1013.25 hPa) or in vacuum. The assembly does not necessarily need to be consolidated by a thermal treatment. However, an anneal, at a temperature preferably lower than 200° C., may advantageously be performed.

As shown in the appended drawings, handle substrate 100 comprises a base 110 and raised elements 120 (pillars or columns). The surface of elements 120 may be of different shapes. It may be square, rectangular, or also circular. Raised elements 120 have, for example, a height in the range from 1 μm and 200 μm or more specifically from 10 μm to 100 μm. These elements 120 are preferably spaced apart by more than 10 μm or even more than 50 μm to allow the infiltration of the etchant (gaseous or liquid) by capillarity into the network formed by raised elements 120.

Base 110 and the raised elements may be made of different materials. Preferably, they are made of a same material.

Handle substrate 100 is preferably obtained from a solid substrate. It may be a substrate made of metal or of a semiconductor material, for example.

Figure 2A:
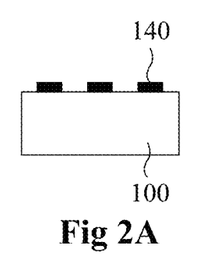
FIGS. 2A, 2B, 2C, and 2D show, schematically, different steps of a method of manufacturing a handle substrate according to a specific embodiment of the invention.
Figure 2B:
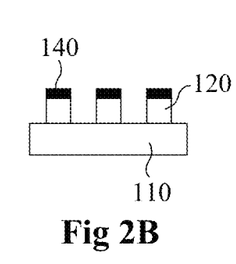
Figure 2C:
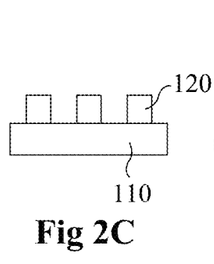
Figure 2D:
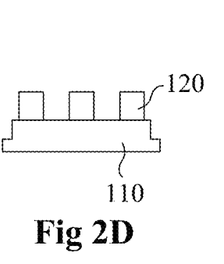

In particular, the raised elements 120 of handle substrate 100 may be formed by means of a photolithography step, for example by means of the following sub-steps, shown in FIGS. 2A, 2B, 2C, and 2D:
locally depositing a resin 140 on a substrate (FIG. 2A),
etching the portions of the substrate not covered by resin 140 to form raised elements 120 in the substrate (FIG. 2B),
removing resin 140 (FIG. 2C),
if necessary, trimming the substrate (FIG. 2D).

The trimming of the wafer edge enables to avoid a possible edge contact between handle substrate 100 and the substrate of interest 200.

The trimming may for example be carried out by photolithography/etching, or also by mechanical trimming by means of a diamond saw. The trimming width is, for example, in the range from 1 to 5 mm and/or its depth is, for example, in the range from 100 to 250 µm.

During the etch step, the patterns 250 formed on the substrate of interest 200 by the vertical etching may also undergo a horizontal etching, which thus modifies their lateral dimensions. This lateral etching effect may be taken into account in the sizing of raised elements 120 to be able to obtain patterns 250 having the desired dimensions.

Further, during step b), it is possible for the etchant to not only etch the material sensitive to the etchant, but also the flanks of the raised elements 120 of handle substrate 100. For example, for an etching of the substrate of interest 200 by a few tens of micrometers, it is possible for the lateral dimension of the elements 120 of handle substrate 100 to also be decreased by a few tens of micrometers. If this handle substrate 100 is used again, the patterns 250 etched on the new substrate of interest will thus have a smaller dimension than that obtained during the previous use. For certain applications, particularly for applications requiring fairly large patterns 250 (typically millimeter-range or centimeter-range patterns), a tolerance on dimensional variations of a few tens of micrometers is acceptable. For other applications, in particular for applications requiring patterns of smaller dimensions, for example of a dimension smaller than one millimeter, it is desirable for the dimensions of the raised elements 120 of handle substrate 100 to be identical or substantially identical from one substrate of interest 200 to another substrate of interest.

To avoid any dimensional variation due to the etching, it is possible, for example, to cover the raised elements 120 with a protective layer 130, 135. This protective layer may be made of a hydrophobic material that will prevent the action of aqueous etching solutions, or of a material inert with respect to the etchant (or at least having a low etching rate by the etchant). A handle substrate made of a material inert with respect to the etchant (or at least having a low rate of etching by the etchant) may also be selected.

According to a first advantageous variant, the protective layer is an oxide layer 135. The oxide layer is inert with respect to the etchant. Oxide layer 135 may have a thickness in the range from 20 nm to 5,000 nm. The layer may also be called a film. It may be a thermal oxide, a native oxide, or an oxide deposited, for example, by plasma-assisted or non-assisted chemical vapor deposition of silicon alkoxide such as tetraethyl orthosilicate (TEOS) or silane.

Figure 3:
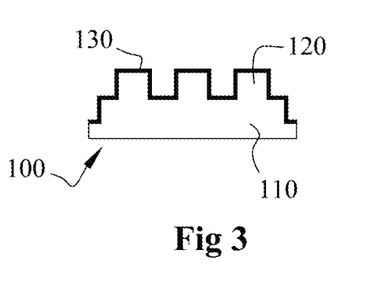
FIG. 3 shows, schematically and in cross-section view, a handle substrate covered with a protective layer according to a specific embodiment of the invention.

Oxide layer 135 may completely cover the raised elements 120 of substrate 100 (FIG. 3). It does not interfere with the bonding.

In particular, in the case of a silicon handle substrate 100, the oxide film is present over the entire handle substrate 110.

Advantageously, a handle substrate 100 coated with a silicon oxide layer will be used to form patterns 250 on a substrate of interest 200 made of silicon or of a metal such as copper. Silicon oxide being little sensitive to etchants of silicon (such as KOH, TMAH, or an HF/HNO$_3$ mixture) or to etchants of metals such as copper (for example, solutions formed of an H$_2$SO$_4$/H$_2$O$_2$/H$_2$O mixture), handle substrate 100 will not be etched and the geometry as well as the dimensions of the raised elements 120 will be preserved.

According to a second advantageous variant, handle substrate 100 may be partially or totally covered with a hydrophobic layer 130. Hydrophobic layer 130 acts as a barrier against the aqueous etchant. Hydrophobic layer 130 may be inorganic or organic. The layer may also be called film.

The selection of the hydrophobic layer 130 will depend on handle substrate 100, on the substrate of interest 200, and on the etching solution 300.

Hydrophobic layer 130 has, for example, a thickness in the range from 2 to 1,000 nm.

It may be a hydrophobic layer 130 obtained from a polymer or from a silyl (also called organo-silyl).

The selected hydrophobic compound preferably comprises one or a plurality of halogen groups, in particular fluorine or chlorine groups. Preferably, the hydrophobic compound comprises a carbon chain of at least 5 carbon atoms.

The silane may be a chlorosilane such as octadecyl-trichlorosilane (OTS=CH$_3$(—CH$_2$)$_{17}$—SiCl$_3$) commercialized by Sigma Aldrich.

The polymers may be fluoropolymers such as for example the Novec™ 1720 EGC polymer commercialized by 3M™, the Optool commercialized by DAIKIN, and the Novec™ 2202 EGC polymer commercialized by 3M™. The hydrophobic compound may be selected from among chlorosilanes such as perfluorodecyl-trichlorosilane (FDTS=Cl$_3$Si (CH$_2$)$_2$(CF$_2$)$_7$CF$_3$) commercialized by Sigma-Aldrich, perfluorodecyldimethylchlorosilane (FDDMCS=CF$_3$(CF$_2$)$_7$ (CH$_2$)$_2$(CH$_3$)$_2$SiCl) commercialized by Sigma-Aldrich.

Preferably, hydrophobic layer 130 is deposited by liquid deposition.

Figure 4A:
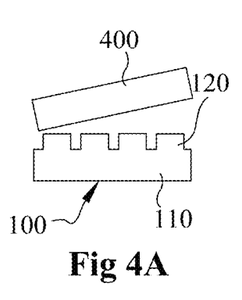
FIGS. 4A, 4B, 4C, 4D, and 4E show, schematically, different steps of a method of making a handle substrate hydrophobic according to a specific embodiment of the invention.
Figure 4B:
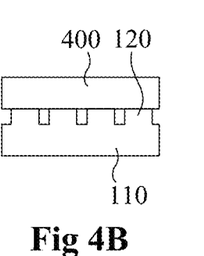
Figure 4C:
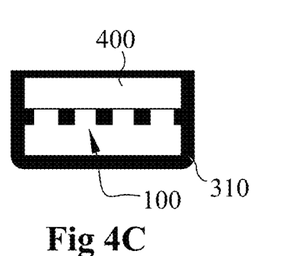
Figure 4D:
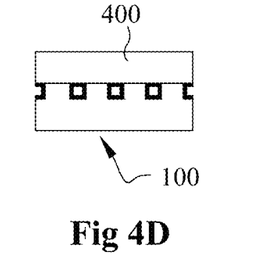
Figure 4E:
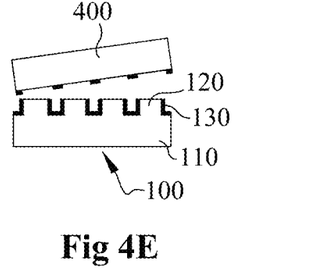

For example, referring to FIGS. 4A to 4E, hydrophobic layer 130 may be deposited according to the following steps:
  bonding handle substrate 100 to a temporary substrate 400 (FIGS. 4A and 4B),
  placing into contact the obtained assembly with a solution 310 containing the hydrophobic compound, for example by immersion (FIG. 4C),
  after a possible rinsing, drying handle substrate 100, whereby handle substrate 100 is covered, locally or even completely, with a hydrophobic layer 130 (FIG. 4D),
  separating handle substrate 100 from temporary substrate 400 (FIG. 4E).

The side walls (flanks) of the raised elements 120 of handle substrate 100 are covered with a hydrophobic film 130. The thickness of hydrophobic film 130 is, for example, in the order of some ten nanometers. The portions of handle substrate 100 not exposed to the hydrophobic compound are compatible with a direct bonding process.

Temporary substrate 400 may be recycled, for example, by implementing an oxygen plasma treatment followed by a wet cleaning.

Hydrophobic film 130 will make the contact between the surface of the handle substrate 100 and etching solution 300 impossible. Only the material sensitive to the etchant of the substrate of interest 100 to be structured is etched, while preserving the morphology of the raised elements 120 of handle substrate 100.

According to another advantageous embodiment, a handle substrate 100 and a substrate of interest 200 having considerably different etch rates in the presence of an etchant will be used. Very advantageously, etching solution 300 does not etch, or only slightly, the handle substrate.

Advantageously, handle substrate 100 and the thin film 220 to be structured are made of different materials. For example, it is possible to select different materials from among a metal, a semiconductor material, an oxide, etc.

According to another advantageous variant, the material forming handle substrate 100 may have a crystalline orientation different from that of the thin film 120 to be structured of the substrate of interest 100. Thus, even if the materials are identical, their etch rates in a given solution will be different. The crystalline orientation is chosen so that the etch rate of handle substrate 100 in the etching solution is lower than the etch rate of layer 220 in etching solution 300.

For example, with silicon, it is possible to benefit from certain anisotropic etching properties to obtain this effect. For example, the <111> planes of silicon have a much lower etch rate with TMAH, TEAH, or KOH than the exposed <001> surface. This makes it possible to greatly limit lateral etching by making <111> planes appear.

The substrate of interest 200 comprises support substrate 210 covered with thin film 220 comprising at least one material sensitive to an etchant.

The substrate of interest 200 may be a SOI ('Silicon on Insulator') substrate, that is, comprising a support substrate 210 covered with a thin film of buried oxide and a silicon layer 220. The thin oxide film can play the role of an etch stop layer (vertical etching).

Alternatively, it may be a solid substrate 210 made of semiconductor material (silicon for example) covered with a dielectric layer 220, in particular an oxide layer (silicon oxide in particular).

Within thin film 220, elements 240 may be arranged. These elements 240 form vertical walls in thin film 220. These elements 240 surround the second areas Z2. They form protective barriers 240 enabling to stop lateral overetching, which may sometimes accompany the vertical etching of the etched material. The width of this barrier will be selected to be sufficiently significant to stop overetching. Elements 240 may have identical or different shapes. They are, of course, made of a material different from the material sensitive to the etchant.

The positioning of elements 240 is preferably selected so that, during the bonding of handle substrate 100 and of the substrate of interest 200, elements 240 are positioned totally or partially under the raised elements of handle substrate 100. The second areas Z2 to be protected are thus not exposed to the etchant.

A lateral tolerance can also be envisaged. For example, one of the raised elements 120 may protrude from the desired location of pattern 250 or be offset from the desired location of pattern 250.

Figure 5A:
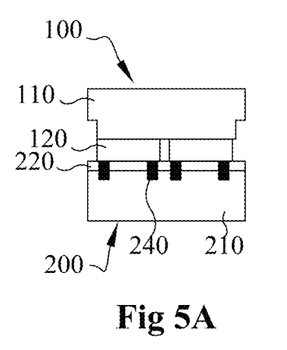
FIGS. 5A, 5B, and 5C show, schematically, a plurality of configurations after the bonding of a handle substrate to a substrate of interest, according to different specific embodiments of the invention.
Figure 5B:
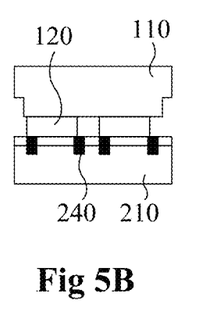
Figure 5C:
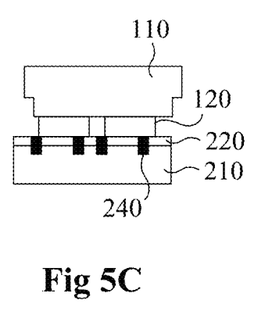

FIGS. 5A, 5B, and 5C show different possible configurations.

Raised element 120 may, for example, have a larger surface area than the surface to be protected positioned between protective barriers 240 (FIG. 5A), or a misalignment may exist between raised elements 120 and protective barriers 240, protective barriers 240 thus protruding from raised element 120 (FIGS. 5B and 5C).

However, in these different configurations, the etching is effective and stops at protective barrier 240. Obviously, this case has its limits and the underetch width is selected so as not to be too significant, for example a few tens of microns is acceptable. Preferably, it will not exceed 1 mm and, more specifically, it will not exceed 500 µm.

Figure 6A:
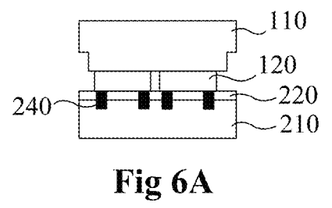
FIGS. 6A, 6B, 6C, and 6D show, schematically, different steps of a method structuring a substrate of interest according to another specific embodiment of the invention.
Figure 6B:
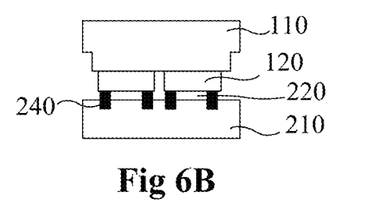
Figure 6C:
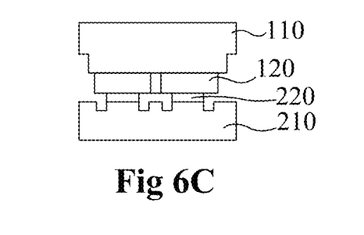
Figure 6D:
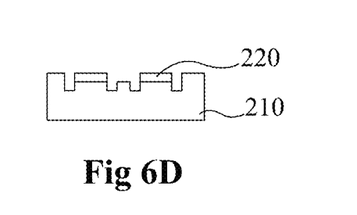

When thin film 220 comprises protective barriers 240, the method may comprise between step b) and step c) an additional step during which protective barriers 240 are removed. The method then comprises the following steps:
- bonding handle substrate 100 and the substrate of interest 200 (FIG. 6A),
- etching the etch-sensitive material present in the first areas Z1 of thin film 220 not protected by raised elements 120, with a suitable etchant (FIG. 6B),
- etching protective barriers 240 with another etchant (FIG. 6C),
- separating handle substrate 100 from the substrate of interest 200 (FIG. 6D).

For certain applications, thin film 220 may comprise a base material (oxide in particular) and pads 230, in particular metal pads (FIGS. 7A to 7D, 8A to 8D, and 9A to 9C).

In the case where the etch-sensitive material corresponds to pads 230, the base material is not etched, and there is obtained a thin film 220 comprising a plurality of holes (blind or running through thin film 220) and raised patterns 250 (FIGS. 7A to 7D). The holes are obtained by removal of pads 230. The raised patterns 250 correspond to the second portions Z2 of thin film 220, which was protected by the raised elements 120 of handle substrate 100.

According to a specific embodiment, thin film 120 comprises a base material, protective barriers 240, and pads 230.

Pads 230 may be surrounded by a protective layer to protect them during the etching step. For example, Ti and TiN or Ta and TaN layers may surround copper pads 230. Specific types of etching may then be used for these materials.

According to a first alternative embodiment, the protective barriers of base material 240 and pads 230 are sensitive to the same etchant. Protective barriers 240 are preferably made of the same material as pads 230. Even more preferably, it is a metal, such as copper. Advantageously, the base material is an oxide, for example a silicon oxide. Protective barriers 240 and pads 230 can thus be removed during a single etch step (FIGS. 8A to 8D). A thin film 220 comprising a plurality of holes (blind or running through thin film 220) in first areas Z1 is thus obtained. The second areas Z2 of thin film 220 facing raised elements 120 are preserved during the etch step.

Figure 9A:
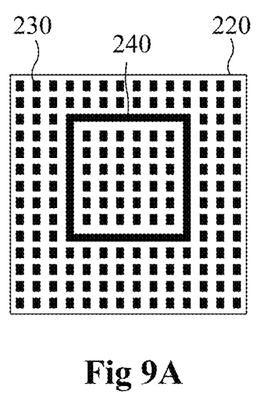
FIGS. 9A, 9B, and 9C schematically show different steps of a method of structuring a substrate of interest according to another specific embodiment, the substrate being shown in top view and the dotted lines representing the position of a raised element of the handle substrate.
Figure 9B:
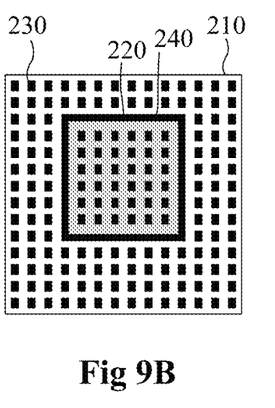

According to a second alternative embodiment, the base material is sensitive to the etchant. Protective barriers 240 and pads 230 are not sensitive to the etchant (FIG. 9A). Protective barriers 240 and pads 230 may be made of the same material or of different materials. For example, protective barriers 240 and pads 230 are made of metal, preferably of copper. The base material is, for example, an oxide, and particularly a silicon oxide. During the etch step, the base material present in first areas Z1 is etched. Protective barriers 240 and metal pads 230, non-sensitive to the etching element, are preserved during the etch step (FIG. 9B). A structure comprising raised patterns 250 surrounded by protective barriers 240 is obtained. Raised patterns 250 comprise the base material in which pads 230 are dispersed. Patterns 250 may be surrounded by protective barriers 240. Between patterns 250, support substrate 210 is covered with metal pads 230 (FIG. 9B).

Figure 9C:
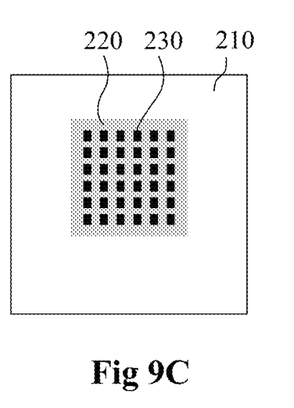

It is possible to carry out an additional etch step (or a plurality of additional etch steps) to remove metal pads 230 and/or protective barriers 240 (FIG. 9C).

Metal barriers 240 and/or metal pads 230 may be inserted into the oxide layer, for example with a Damascene-type method.

In particular, it is possible to select metal barriers 240 and/or metal pads 230 made of copper inserted in a silicon oxide layer.

Metal barriers 240 and/or metal pads 230 may be formed, for example, by physical vapor deposition (PVD) and/or by electrochemical deposition (ECD).

Preferably, to form copper 230 elements by ECD, Ti, TiN, and Cu layers will first be deposited by PVD. ECD may be used to form thicker elements than PVD. It is also possible to replace the Ti and TiN layers with Ta and TaN layers. The Ti/TiN or Ta/TaN layers play the role of a barrier to the diffusion of copper into the silicon.

At the end of step b) or of the additional etch step, the assembly may be rinsed by immersion and dried. The drying may be carried out by centrifugation.

Figure 7A:
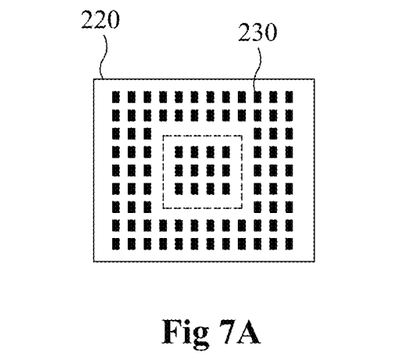
FIGS. 7A and 7B schematically show different steps of a method of structuring a substrate of interest according to another specific embodiment, the substrate being shown in top view and the dotted lines representing the position of a raised element of the handle substrate.
Figure 7B:
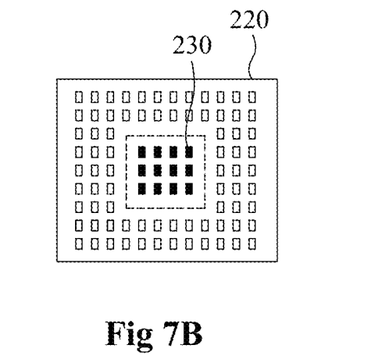
Figure 7C:
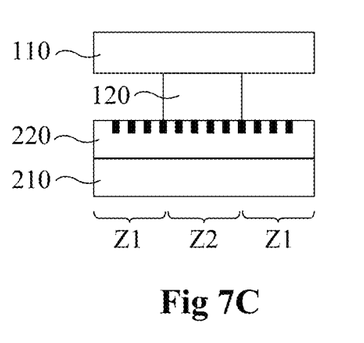
FIGS. 7C and 7D schematically show in cross-section view the substrate shown in FIGS. 7A and 7B, respectively.
Figure 7D:
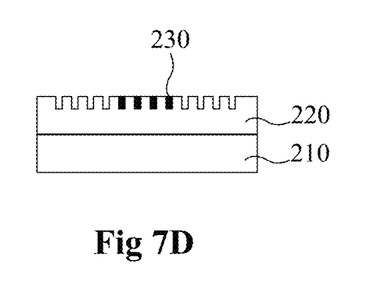
Figure 8A:
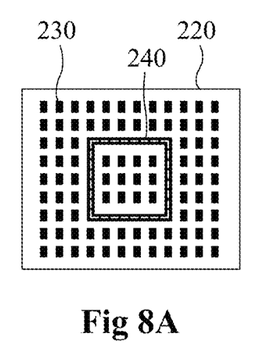
FIGS. 8A and 8B schematically show different steps of a method of structuring a substrate of interest according to another specific embodiment, the substrate being shown in top view and the dotted lines representing the position of a raised element of the handle substrate.
Figure 8B:
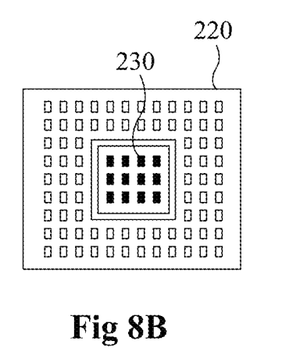
Figure 8C:
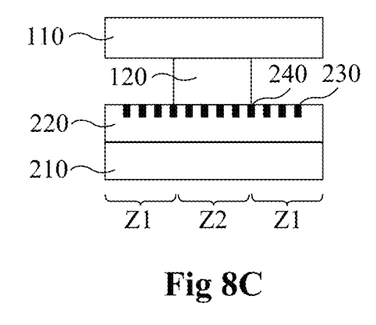
FIGS. 8C and 8D schematically show in cross-section view the substrate shown in FIGS. 8A and 8B, respectively.
Figure 8D:
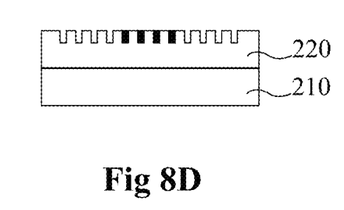

The obtained substrate of interest 200 comprises a support substrate covered with raised patterns 250. The thickness of the patterns depends on the targeted application. The patterns may be formed of a base material (FIG. 6D) or of a base material having pads 230 dispersed therein (FIG. 7D). An element 240 may surround the patterns (FIG. 9B).

Apart from patterns 250, a plurality of alternative embodiments are possible, and in particular:
- support substrate 210 may be covered with a thin film 220 exhibiting blind holes (FIG. 7B) or holes running through said layer 220,
- pads 230 may be positioned on support substrate 210 (FIG. 9B),
- support substrate 210 may have a free surface (that is, apart from the patterns, no element covers support substrate 210) (FIG. 9C).

During step c), the assembly is disassembled, for example by inserting a wedge between the two substrates 100, 200.

Handle substrate 100 may be used in a new bond/etch cycle. A cleaning is advantageously carried out between each use.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

ILLUSTRATIVE AND NON-LIMITING EXAMPLES OF DIFFERENT EMBODIMENTS

In the following examples, the substrates are formed from silicon wafers having a 200-mm diameter.

Example 1

A silicon wafer (handle substrate 100) undergoes an oxidation to obtain on the surface a 100-nm silicon oxide film. A photolithography/etching method enables to form 10×10-mm$^2$ silicon oxide pads with a 100-μm thickness (100 nm of SiO$_2$ and 99.9 μm of silicon). A trimming of the edge of wafer 100 is performed with a diamond saw to a 3-mm width and a 200-μm depth. The oxide surface of wafer 100 is cleaned by an O$_2$ plasma followed by a CARO, SC1 wet cleaning to make it compatible with a direct bonding method.

An SOI wafer (substrate of interest 200) which exhibits a support substrate 220 covered with a 205-nm silicon film 220 and a 400-nm buried oxide layer undergoes a CARO/SC1 wet cleaning to be made compatible with a direct bonding method.

The two substrates 100, 200 are directly bonded to each other. To remove the native silicon oxide layer, the assembly is immersed for 10 s in a 1% HF solution 300, then rinsed in deionized water. A second etching is then performed for 3 min at 70° C. in a 5 wt. % aqueous TMAH solution. The assembly is then rinsed by immersion in water and then dried by centrifugation.

Handle substrate 100 is removed by inserting a wedge into the structure.

A wafer of interest 200 comprising a silicon support substrate on which are arranged silicon pads 250 of 10×10 mm$^2$ having a 205-nm thickness is obtained.

Example 2

A silicon wafer (handle substrate 100) is formed as described in example 1. It exhibits raised elements 120 (rectangular pads) of 10×5 mm$^2$ and having a 15-μm thickness.

A silicon wafer (temporary substrate 400) is prepared to be made compatible with a direct bonding. Temporary substrate 400 is directly bonded to handle substrate 100. The assembly is immersed in a solution 310 of OTS (octadecyl-trichlorosilane) in isooctane, then rinsed in isooctane. Temporary substrate 400 is then disassembled. Silicon wafer 100 exhibits bonding sites in the form of rectangular pads 120, with a 15-μm height, having its environment, including the flanks, covered with a hydrophobic film 130.

An SOI wafer (substrate of interest 200) which comprises a support substrate 210 covered with a 205-nm silicon film 220 and a 400-nm buried oxide layer undergoes a CARO/SC1 wet cleaning to be made compatible with a direct bonding method.

The substrate of interest 200 is directly bonded to handle substrate 100. To remove the native oxide layer from the silicon, the assembly is immersed for 10 s in a 1% HF solution 300, then rinsed in DI water. A second etching is then performed for 3 min at 70° C. in a 5 wt. % aqueous TMAH solution designed to etch the silicon. The buried oxide layer of the substrate of interest enables to stop the etching. The assembly is then rinsed by immersion in water and then dried by centrifugation.

Substrate handle 100 is disassembled by inserting a wedge into the structure. Hydrophobic film 130 has enabled to protect from etching the silicon forming the raised elements 120 of substrate 100, the dimensions of which have not been altered.

A wafer of interest 200 comprising a silicon support substrate on which are arranged 10×5-mm$^2$ rectangular silicon patterns 250 having a 205-nm thickness is obtained.

Example 3

A photolithography/etching is performed on a silicon wafer (handle substrate 100) to form cylindrical elements 120 with a 10-mm diameter and a 60-μm thickness. A trimming of the edge of handle substrate 100 is performed with a diamond saw: to a 5-mm width and a 200-μm depth. This wafer is oxidized to form a 400-nm oxide film on the surface.

An SOI wafer (substrate of interest 200) comprises a support substrate 210 covered with a 205-nm silicon film 220 and a 400-nm buried oxide layer. The substrate of interest 200 undergoes a CARO/SC1 wet cleaning to be made compatible with a direct bonding method. This substrate is immersed for 10 s in an etching solution 300 (1% HF), then rinsed in DI water.

The two substrates 100, 200 are directly bonded. The assembly is immersed for 3 min at 70° C. in a 5 wt. % aqueous TMAH solution intended to etch the silicon. The buried oxide layer of the substrate of interest 200 enables to stop the etching. The assembly is then rinsed by immersion in water and then dried by centrifugation.

The wafer (handle substrate 100) is disassembled by inserting a wedge into the structure. The 400-nm oxide film on the surface of substrate 100 has enabled to protect from the silicon etching the raised elements 120 of the substrate, the dimensions of which have not been altered.

A substrate 200 comprising a silicon support substrate on which are arranged cylindrical silicon patterns 250 having a 10-mm diameter and a 205-nm thickness is obtained.

Example 4

On a silicon wafer (handle substrate 100), a photolithography/etching method enables to form raised elements 120 of 10×10 mm² having a 100-µm thickness. A trimming of the edge of this substrate 100 with a diamond saw is performed: to a 3-mm width and a 200-µm depth. The surface of wafer 100 is cleaned by $O_2$ plasma followed by a CARO, SC1 wet cleaning to be made compatible with a direct bonding method.

A wafer (substrate of interest 200) undergoes an oxidation to form a 100-nm oxide film 220 on its surface. This wafer 200 is wet-cleaned to be made compatible with a direct bonding method.

The two substrates 100, 200 are directly bonded. The assembly undergoes an anneal at 150° C. for 2 hrs., then is immersed for 3 min in a 5 vol. % aqueous HF solution intended to etch the silicon oxide. Alternatively, the stack may be treated by being exposed to HF vapors. The assembly is then rinsed by immersion in water and then dried by centrifugation.

Handle substrate 100 is disassembled by inserting a wedge into the structure.

A silicon wafer of interest 200 which exhibits cylindrical silicon oxide patterns 250 of 10×5 mm² and having a 100-nm thickness is obtained.

Example 5

A silicon wafer (handle substrate 100) is formed as described in example 1. It exhibits rectangular pads of 10×5 mm² having a 15-µm thickness.

On a wafer (substrate of interest 200), 400 nm of oxide are deposited from TEOS. There are then deposited by PVD Ti, TiN, and Cu layers having a thickness of 10, 50, and 200 nm. Finally, an electrochemical treatment by ECD enables to deposit a 1,000-nm Cu film. A copper polishing step removes a 200-nm copper thickness and enables to prepare the surface of substrate 200 for a direct bonding.

The two substrates 100, 200 are directly bonded. The assembly is immersed for 2 min in an aqueous solution 300 of DSP ($H_2SO_4/H_2O_2/H_2O$ in a 1/2/50 proportion) to etch the copper layers. The assembly is then rinsed by immersion in water and then dried by centrifugation.

This assembly is immersed in an SC1 solution at 70° C. for 2 min to etch the Ti and TiN layers. The assembly is then rinsed by immersion in water and then dried by centrifugation.

The wafer (handle substrate 100) is disassembled by inserting a wedge into the structure.

A silicon wafer (substrate of interest 200) which exhibits rectangular copper patterns 250 of 10×5 mm² with a 1,000-nm thickness is obtained.

Example 6

A silicon wafer (handle substrate 100) is formed as described in example 1. It exhibits rectangular elements 120 of 5×5 mm² having a 15-µm thickness.

On a wafer (substrate of interest 200), a checkerboard of copper pads 230 surrounded by a thin Ti/TiN protective layer within an oxide layer is formed, as shown in FIG. 9A. A copper protective barrier 240 surrounds areas Z2. The repetition pitch of copper pads 230 is 5 µm for square copper pads 230 having 2.5-µm sides. The copper barrier is 2.5 µm wide at the location of two rows and columns of copper pads. The external width and length of the barrier have the same 5000−3.75−3.75=4992.5-µm dimension. The Ti and TiN layers form a 10-nm and 50-nm thickness. The thickness of copper pads 230 is 500 nm. They are manufactured according to a conventional copper damascene method with Ti/TiN protective layers. A chemical-mechanical polishing is performed after the damascene method to make the surface compatible with a direct hybrid bonding method.

The two substrates 100, 200 are aligned and bonded.

After the bonding, the assembly undergoes an anneal at 150° C. for 2 hrs. The assembly is then immersed for 3 min in a 5 vol. % aqueous solution 300 of HF intended to etch the silicon oxide. The assembly is then rinsed by immersion in water and then dried by centrifugation. The obtained configuration is that of FIG. 9B. The two substrates 100, 200 can be separated and areas of interest compatible with a future direct bonding to another plate of interest are thus obtained. It is also possible not to separate the two substrates 100, 200 and to etch the copper pads 230 not protected by raised elements 120 and/or protective barrier 240. For this purpose, the assembly is immersed for 2 min in an aqueous solution of DSP ($H_2SO_4/H_2O_2/H_2O$ in a 1/2/50 proportion) to etch the copper. The assembly is then rinsed by immersion in water and then dried by centrifugation. This assembly is then immersed in an SC1 solution at 70° C. for 2 min to etch the Ti and TiN layers. The assembly is then rinsed by immersion in water and then dried by centrifugation. The obtained assembly corresponds to the configuration of FIG. 9C. The two substrates 100, 200 can then be separated.

The invention claimed is:

1. Method of structuring a substrate of interest comprising the following steps:
    a) bonding a handle substrate to a substrate of interest, the handle substrate comprising a base and raised elements covering the base, the substrate of interest comprising a support substrate covered by a thin film, the thin film comprising a material sensitive to an etchant, whereby the thin film comprises first areas not covered with the raised elements and second areas covered with the raised elements,
    b) performing a wet or gaseous etching with the etchant to remove the material sensitive to the etchant present in the first areas, the second areas being protected during the etching, whereby the thin film is structured in the form of raised patterns,
    c) separating the handle substrate from the substrate of interest.

2. Method according to claim 1, wherein the thin film comprises a silicon oxide having copper pads arranged therein.

3. Method according to claim 2, wherein the material sensitive to the etchant is the silicon oxide.

4. Method according to claim 3, wherein the method comprises an additional step between step b) and step c) during which the barriers and/or the pads are etched.

5. Method according to claim 2, wherein the material sensitive to the etchant corresponds to the pads.

6. Method according to claim 5, wherein, during the etch step, the barriers and the pads are etched.

7. Method according to claim 1, wherein the thin film comprises copper barriers forming a lateral protection all around the second areas.

8. Method according to claim 1, wherein the method comprises a subsequent step during which the handle substrate is used to structure another substrate of interest.

9. Method according to claim 1, wherein, prior to the bonding step, the method comprises a step during which the handle substrate is covered with a protective layer against the etchant of the sensitive material.

10. Method according to claim 9, wherein the protective layer is an oxide layer or a hydrophobic layer formed of one or a plurality of compounds selected from chlorosilanes, and fluoropolymers.

11. Method according to claim 1, wherein the method comprises, prior to step a), a step during which the handle substrate is manufactured by locally forming a resin on a substrate, by etching the substrate, and by removing the resin.

\* \* \* \* \*

UNITED STATES PATENT AND TRADEMARK OFFICE
CERTIFICATE OF CORRECTION

Page 1 of 1

PATENT NO. : 12,288,694 B2
APPLICATION NO. : 18/804455
DATED : April 29, 2025
INVENTOR(S) : Pierre Montmeat et al.

It is certified that error appears in the above-identified patent and that said Letters Patent is hereby corrected as shown below:

On the Title Page

Item (30) insert:
--(30) Foreign Application Priority Data
Aug. 18, 2023 (FR) ....................2308799--

Signed and Sealed this
Seventeenth Day of June, 2025

Coke Morgan Stewart
*Acting Director of the United States Patent and Trademark Office*